United States Patent
Narazaki (10) Patent No.: US 8,519,733 B2
(45) Date of Patent: Aug. 27, 2013

(54) METHOD OF MEASURING CHARACTERISTICS OF A SEMICONDUCTOR ELEMENT AND METHOD OF MANUFACTURING A SEMICONDUCTOR DEVICE

(75) Inventor: Atsushi Narazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 385 days.

(21) Appl. No.: 13/044,985

(22) Filed: Mar. 10, 2011

(65) Prior Publication Data

US 2012/0013349 A1 Jan. 19, 2012

(30) Foreign Application Priority Data

Jul. 15, 2010 (JP) ................................. 2010-160399

(51) Int. Cl.
*G01R 31/26* (2006.01)
*G01R 31/02* (2006.01)

(52) U.S. Cl.
USPC ................. 324/762.05; 324/762.01

(58) Field of Classification Search
USPC ....................... 324/762.01, 762.05
See application file for complete search history.

(56) References Cited

U.S. PATENT DOCUMENTS

| 7,821,283 | B2 * | 10/2010 | Yamada et al. | 324/762.05 |
| 2002/0186032 | A1 | 12/2002 | Okabe | |
| 2003/0139043 | A1 | 7/2003 | Marcus et al. | |
| 2008/0105964 | A1 * | 5/2008 | Iwamura et al. | 257/686 |

FOREIGN PATENT DOCUMENTS

JP 8-153763 6/1996

OTHER PUBLICATIONS

German Office Action Issued Dec. 13, 2012 in Patent Application No. 10 2011 077 778.4 (with English translation).

* cited by examiner

*Primary Examiner* — Amy He
(74) *Attorney, Agent, or Firm* — Oblon, Spivak, McClelland, Maier & Neustadt, L.L.P.

(57) ABSTRACT

A measurement terminal is arranged at an edge of a semiconductor wafer to be apart from a gate electrode and a source electrode formed in a surface portion on one side in a thickness direction of a semiconductor wafer so that an electrode contact portion is in contact with a drain electrode on the other side in the thickness direction of the semiconductor wafer and that a terminal contact portion is exposed to the one side in the thickness direction of the semiconductor wafer. A probe terminal is brought into contact with the terminal contact portion of the measurement terminal and the probe terminal is brought into contact with the gate electrode and the source electrode, to thereby measure electrical characteristics of a MOSFET.

8 Claims, 9 Drawing Sheets

F I G. 1 6

METHOD OF MEASURING CHARACTERISTICS OF A SEMICONDUCTOR ELEMENT AND METHOD OF MANUFACTURING A SEMICONDUCTOR DEVICE

BACKGROUND OF THE INVENTION

1. Field of the Invention

The present invention relates to a method of measuring characteristics of a semiconductor element and a method of manufacturing a semiconductor device using the same.

2. Description of the Background Art

In the steps of manufacturing for semiconductor chips constituting a semiconductor device, a so-called wafer test is conducted in which a conduction test for semiconductor elements formed on a semiconductor wafer (hereinafter, also simply referred to as a "wafer") is conducted in a wafer state. In some cases, electrodes of a semiconductor element are formed not only on one side in a wafer thickness direction (hereinafter, also referred to as a "front surface side") but also on the other side of the wafer thickness direction (hereinafter, also referred to as a "back surface side"). In a conventional wafer test, the back surface side of the wafer is stuck fast to a conductive wafer stage. In order to render the electrode on the back surface side (hereinafter, also referred to as a "back surface electrode") conductive, the back surface electrode is rendered conductive through the wafer stage used as an electrode.

For example, in a case of a wafer on which a power metal oxide semiconductor field effect transistor (MOSFET) is formed (hereinafter, also referred to as a "power MOSFET wafer") as a semiconductor element, a drain electrode is formed on the back surface side and a gate electrode and a source electrode are formed on the front surface side. Therefore, the back surface side of the wafer is stuck fast to the wafer stage to electrically connect the drain electrode on the back surface side to the wafer stage, and the gate electrode and the source electrode on the front surface side are brought into contact with a probe terminal, to thereby secure an application electrode in the wafer test.

In order to achieve higher performance of a semiconductor device, development has been made to slim down a wafer. A slim wafer reduces the resistance between a drain and a source, which reduces conduction loss.

In a case where a wafer is slimmed down, the wafer is likely to be warped, which makes handling thereof difficult. For example, a wafer test is conducted on the warped wafer in a state of single wafer (hereinafter, referred to as a "state of bare wafer"), the wafer is damaged, for example, is cracked or broken. Therefore, a wafer test cannot be conducted in a state of bare wafer. In order to conduct a wafer test, the wafer needs to be supported by attaching a dedicated sheet or an insulating substrate to the back surface of the wafer.

In a case where the wafer is supported by attaching a dedicated sheet or the like to the back surface of the wafer, the wafer is insulated from the wafer stage even if the wafer is stuck fast to the wafer stage. This leads to a problem that an electrode on a back surface side of the wafer, for example, in a case of a power MOSFET wafer, a drain electrode of a power MOSFET cannot be rendered conductive.

To solve the above-mentioned problem, there is used a method of conducting a wafer test with a specific electrode formed on the front surface side of the wafer as a drain electrode or a method of conducting a wafer test with a source electrode formed on a front surface side of an adjacent chip as a drain electrode (for example, see Japanese Patent Application Laid-Open No. H08-153763).

However, in the conventional method disclosed in, for example, Japanese Patent Application Laid-Open No. H08-153763, a wafer test is conducted by bringing an electrode formed on a front surface side of a wafer into conduction and applying a voltage between the electrode and a source electrode, and thus a depletion layer from the source side fails to extend sufficiently toward a drain side that is the back surface side of the wafer. Accordingly, electrical characteristics of a semiconductor element cannot be measured with accuracy. For example, while an initial channel leakage current can be measured with accuracy, the leakage current under application of high voltage cannot be measured accurately.

SUMMARY OF THE INVENTION

An object of the present invention is to provide a method of measuring characteristics of a semiconductor element capable of bringing, from one side in a thickness direction of a wafer, an electrode on the other side in the thickness direction of the wafer into conduction and accurately measuring electrical characteristics of a semiconductor element, for example, a leakage current during application of high voltage, and a method of manufacturing a semiconductor device using the same.

In a method of measuring characteristics of a semiconductor element according to the present invention, measurement of electrical characteristics is performed on a semiconductor element including a one-side electrode in a surface portion on a one side in a thickness direction of a semiconductor substrate and including the other-side electrode in a surface portion on the other side in the thickness direction of the semiconductor substrate. The method of measuring characteristics of a semiconductor element includes an arrangement step and a measurement step.

In the arrangement step, a measurement terminal including a first conductive part having conductivity and a second conductive part having conductivity and electrically connected to the first conductive part is arranged at an edge of the semiconductor substrate to be apart from the one-side electrode so that the first conductive part is in contact with the other-side electrode on the other side in the thickness direction of the semiconductor substrate and that the second conductive part is exposed to the one side in the thickness direction of the semiconductor substrate.

In the measurement step, the electrical characteristics of the semiconductor element are measured by bringing a probe terminal into contact with the second conductive part and the one-side electrode from the one side in the thickness direction of the semiconductor substrate.

According to the method of measuring characteristics of a semiconductor element, the measurement terminal including the first conductive part and the second conductive part is arranged at the edge of the semiconductor substrate in the arrangement step, and the probe terminal is brought into contact with the second conductive part and the one-side electrode in the measurement step, to thereby measure electrical characteristics of a semiconductor element.

The measurement terminal is arranged to be apart from the one-side electrode so that the first conductive part is in contact with the other-side electrode on the other side in the thickness direction of the semiconductor substrate and that the second conductive part is exposed to the one side in the thickness direction of the semiconductor substrate. Accordingly, the other-side electrode can be rendered conductive from the one side in the thickness direction of the semiconductor substrate by bringing the probe terminal into contact with the second conductive part of the measurement terminal from the one side in the thickness direction of the semiconductor substrate.

Therefore, even in a case where an insulating support member is attached to the surface portion on the other side in the thickness direction of the semiconductor substrate, the electrical characteristics of the semiconductor element can be accurately measured from the one side in the thickness direction of the semiconductor substrate by bringing the probe terminal into contact with the second conductive part of the measurement terminal and the one-side electrode from the one side in the thickness direction of the semiconductor substrate.

For example, a voltage can be applied between the other-side electrode and the one-side electrode from the one side in the thickness direction of the semiconductor substrate, whereby it is possible to measure a breakdown voltage of a semiconductor element with accuracy. In addition, it is possible to accurately measure a leakage current generated when a high voltage is applied between the other-side electrode and the one-side electrode.

A method of manufacturing a semiconductor device according to the present invention includes the steps of preparing a semiconductor substrate, measuring electrical characteristics of semiconductor elements, obtaining semiconductor chips, and assembling a semiconductor device.

In the step of preparing the semiconductor substrate, there is prepared a semiconductor substrate including a plurality of semiconductor elements formed thereon, the semiconductor elements each including a one-side electrode in a surface portion on one side in a thickness direction of the semiconductor substrate and including the other-side electrode in a surface portion on the other side in the thickness direction of the semiconductor substrate.

In the step of measuring electrical characteristics of the semiconductor elements, the electrical characteristics of the semiconductor elements are measured by the method of measuring characteristics of a semiconductor element according to the present invention described above.

In the step of obtaining the semiconductor chips, the semiconductor chips are obtained by cutting the semiconductor substrate so as to include at least one of the semiconductor elements.

In the step of assembling the semiconductor device, a semiconductor device is assembled using the semiconductor chips.

According to the method of manufacturing a semiconductor device, a semiconductor substrate including a plurality of semiconductor elements formed thereon is prepared, and the electrical characteristics of the semiconductor elements are measured by the method of measuring characteristics of a semiconductor element according to the present invention described above. The semiconductor substrate is cut so as to include at least one semiconductor element, to thereby obtain the semiconductor chips. A semiconductor device is assembled using the semiconductor chips.

According to the method of measuring characteristics of a semiconductor element of the present invention described above, it is possible to accurately measure the electrical characteristics of the semiconductor elements from one side in the thickness direction of the semiconductor substrate even in a case where an insulating support member is attached to the surface portion on the other side in the thickness direction of the semiconductor substrate.

The use of the method of measuring characteristics of a semiconductor element enables to distinguish semiconductor chips including a non-defective semiconductor element more reliably by distinguishing semiconductor chips based on the measurement results. Accordingly, a semiconductor device can be assembled using non-defective semiconductor chips, which improves a manufacturing yield of a semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<Underlying Technology>

A method of measuring characteristics of a semiconductor element according to the underlying technology of the present invention will be described before describing a method of measuring characteristics of a semiconductor element according to the present invention. Description will be given below of, as the method of measuring characteristics of a semiconductor element, a wafer test method in which electrical characteristics of a semiconductor element formed on a semiconductor wafer (hereinafter, also simply referred to as a "wafer") are measured in a wafer state.

Figure 8:
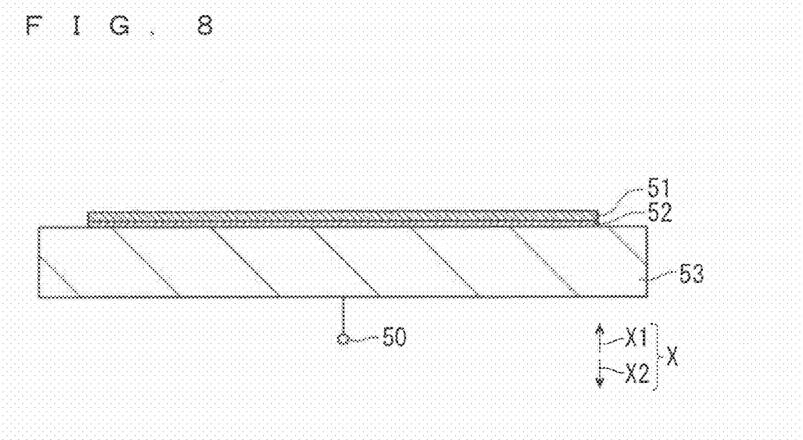
FIG. 8 is a cross-sectional view showing a state of a semiconductor wafer when a wafer test method according to the underlying technology is performed.
Figure 9:
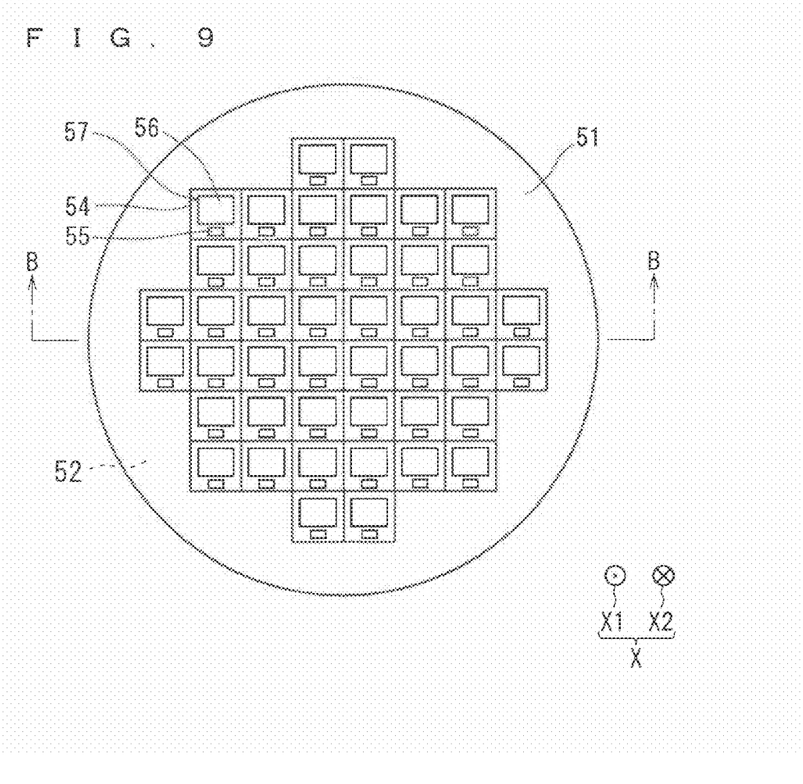
FIG. 9 is a plan view showing the semiconductor wafer shown in FIG. 8 viewed from one side in a thickness direction.
Figure 10:
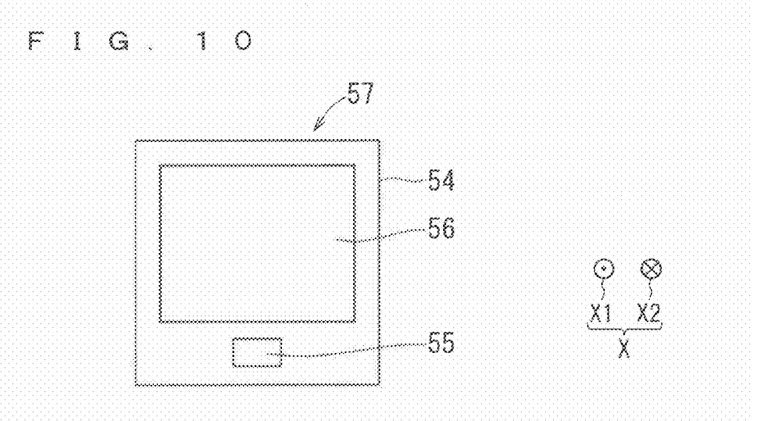
FIG. 10 is a plan view showing a region serving as a semiconductor chip of the semiconductor wafer shown in FIG. 9 viewed from the one side in the thickness direction of the semiconductor wafer.
Figure 11:
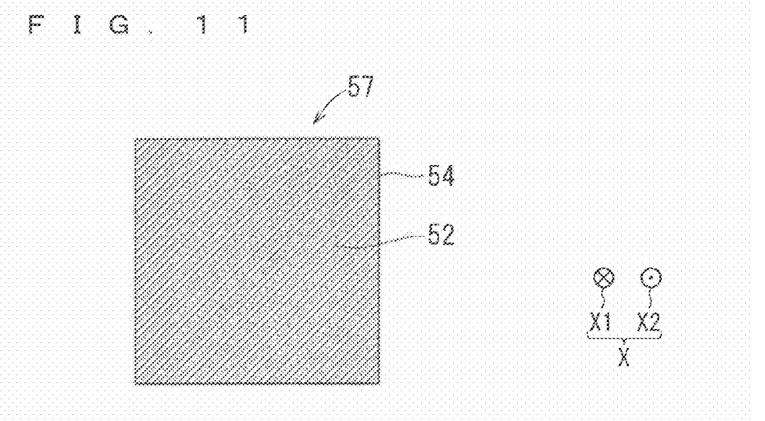
FIG. 11 is a plan view showing the region serving as the semiconductor chip of the semiconductor wafer shown in FIG. 9 viewed from the other side in the thickness direction of the semiconductor wafer.

FIG. 8 is a cross-sectional view showing a state of a semiconductor wafer 51 when the wafer test method of the underlying technology is performed. FIG. 9 is a plan view showing the semiconductor wafer 51 shown in FIG. 8, which is viewed from one side X1 in a thickness direction. FIG. 8 corresponds to a cross-sectional view taken along a cutting plane line B-B in the plan view shown in FIG. 9. FIG. 10 is a plan view showing a region serving as a semiconductor chip 54 of the semiconductor wafer 51 shown in FIG. 9, which is viewed from the one side X1 in the thickness direction of the semiconductor wafer 51. FIG. 11 is a plan view showing the region serving as the semiconductor chip 54 of the semiconductor wafer 51 shown in FIG. 9, which is viewed from the other side X2 in the thickness direction of the semiconductor wafer 51. As to the underlying technology, there is described a wafer test method in a case where a power MOSFET 57 is provided as a semiconductor element.

Formed over an entire surface portion on the other side X2 in the thickness direction (hereinafter, also referred to as a "back surface") of the semiconductor wafer 51 is a drain electrode 52 of the power MOSFET 57. The semiconductor wafer 51 includes a plurality of regions divided into pieces as the semiconductor chips 54 in a step described below. Though not shown in FIG. 8, formed in a surface portion on the one side X1 in the thickness direction (hereinafter, also referred to as a "front surface") of the semiconductor wafer 51 for each region serving as the semiconductor chip 54 are a gate electrode 55 and a source electrode 56 of the power MOSFET 57, as shown in FIG. 9.

In the wafer test, the semiconductor wafer 51 is held such that the other side X2 in the thickness direction thereof, that is, the back surface side thereof is stuck fast to a conductive wafer stage 53. When a terminal 50 of the wafer stage 53 is rendered conductive, the drain electrode 52 on the back surface side of the semiconductor wafer 51 is rendered conductive through the wafer stage 53.

Figure 12:
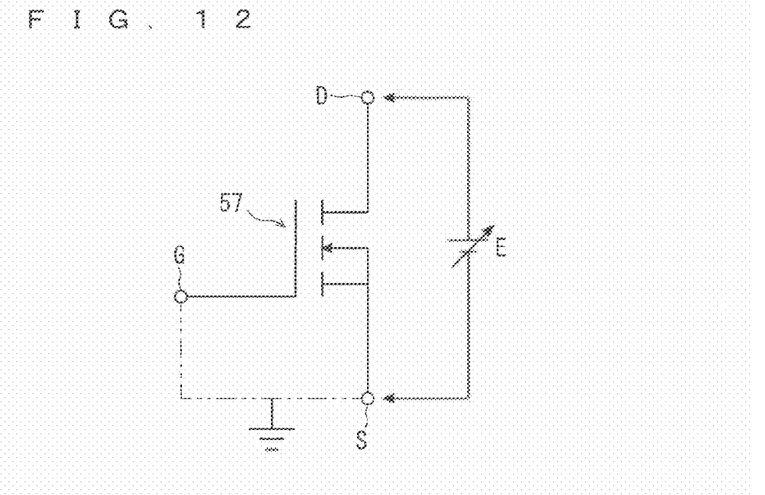
FIG. 12 shows a leakage current measuring circuit of a power MOSFET.

In a case where electrical characteristics of the power MOSFET 57 are evaluated, the gate electrode 55 and the source electrode 56 of each region serving as the semiconductor chip 54 of the semiconductor wafer 51 are brought into contact with a probe terminal to be rendered conductive. FIG. 12 shows a leakage current measuring circuit of the power MOSFET 57. For example, in a case of measuring a leakage current between a drain and a source, as shown in FIG. 12, a voltage is applied from a power supply E to the drain D side after a gate G and a source S are short-circuited, and the flowing current is measured.

Figure 13:
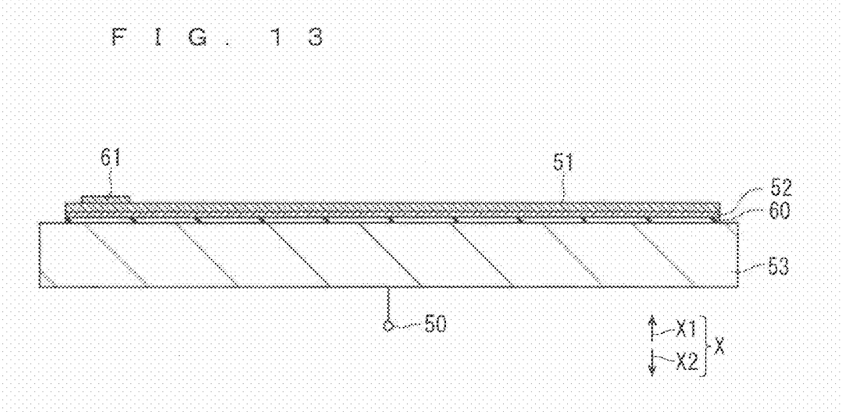
FIG. 13 is a cross-sectional view showing the semiconductor wafer in which a support member is attached to a back surface side thereof.

FIG. 13 is a cross-sectional view showing the semiconductor wafer 51 where a support member 60 is attached to the back surface side thereof. In a case where the semiconductor wafer 51 is slim, that is, a case where the semiconductor wafer 51 has a small thickness dimension, the wafer is likely to be warped, which makes handling thereof difficult. For example, when a wafer test is conducted on the warped wafer in a state of bare wafer, the wafer is damaged, for example, cracked or broken, and thus the wafer test cannot be conducted in the state of bare wafer state. Accordingly, the support member 60 such as an insulating sheet is necessary for the back surface side as shown in FIG. 13, and thus the drain electrode 52 on the back surface side cannot be rendered conductive even if the semiconductor wafer 51 is stuck fast to the wafer stage 53.

Figure 14:
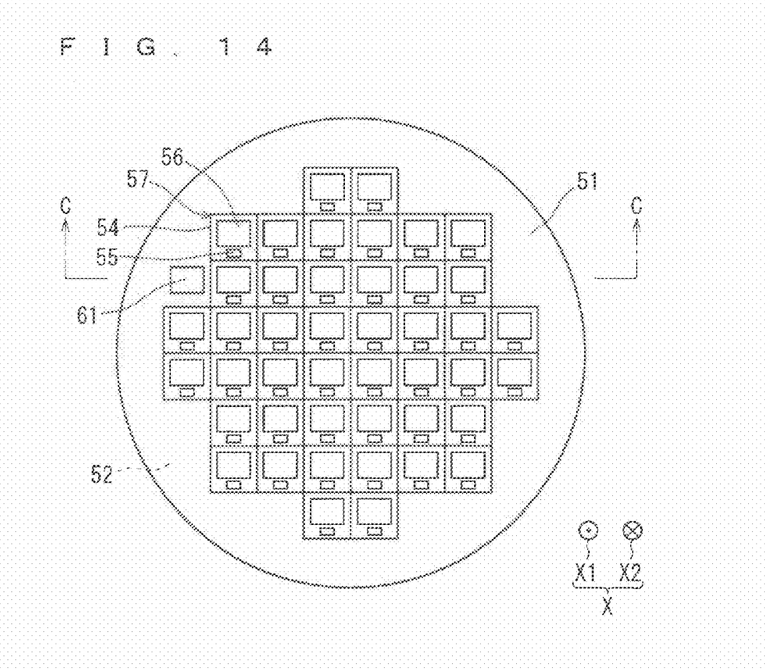
FIG. 14 is a plan view showing the semiconductor wafer on which a front-surface-side drain electrode is formed.

FIG. 14 is a plan view showing the semiconductor wafer 51 on which a front-surface-side drain electrode 61 is formed. FIG. 13 described above corresponds to the cross-sectional view seen from a cutting plane line C-C in the plan view shown in FIG. 14. In a case where the support member 60 is attached to the back surface side of the semiconductor wafer 51, as shown in, for example, FIG. 14, the front-surface-side drain electrode 61 is formed on the front surface of the semiconductor wafer 51. The front-surface-side drain electrode 61 is rendered conductive and a voltage is applied between the front-surface-side drain electrode 61 and the source electrode 56, which makes it possible to evaluate the electrical characteristics of the power MOSFET 57.

Figure 15:
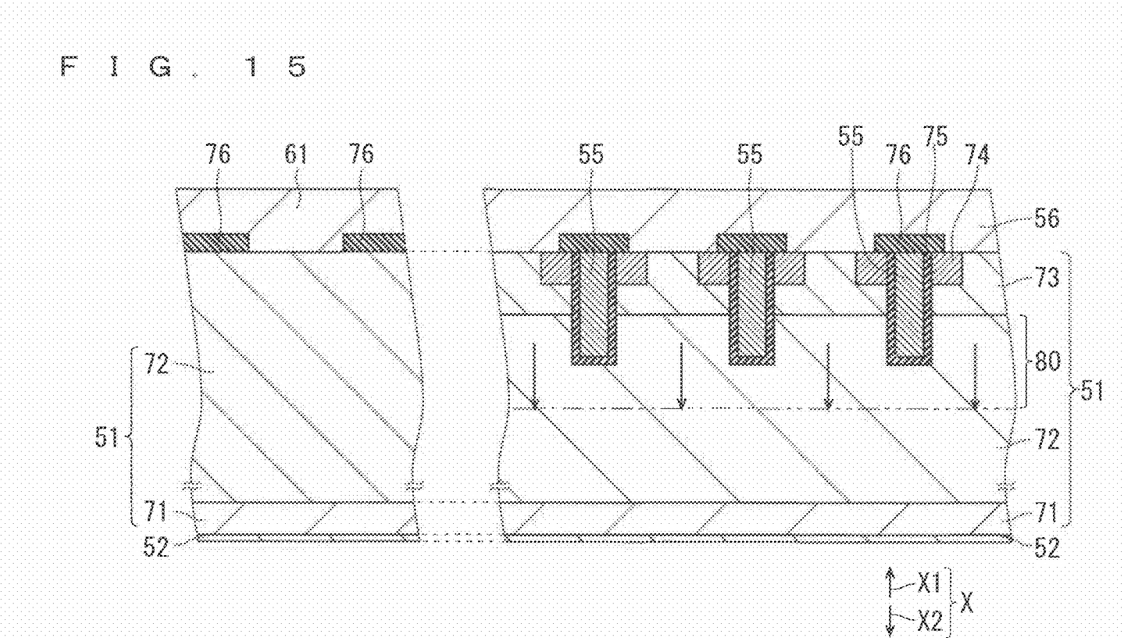
FIG. 15 is a cross-sectional view showing an extent to which a depletion layer extends in the semiconductor wafer in a case where the front-surface-side drain electrode is rendered conductive.
Figure 16:
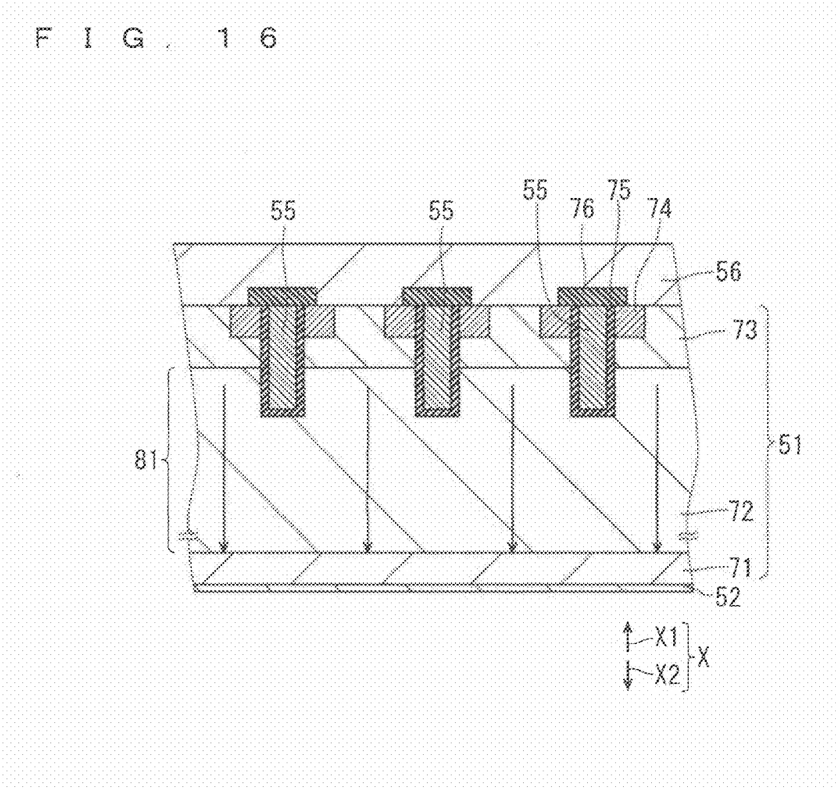
FIG. 16 is a cross-sectional view showing an extent to which a depletion layer extends in the semiconductor wafer in a case where a back-surface-side drain electrode is rendered conductive.

FIG. 15 is a cross-sectional view showing an extent to which a depletion layer 80 extends in the semiconductor wafer 51 in a case where the front-surface-side drain electrode 61 is rendered conductive. FIG. 16 is a cross-sectional view showing an extent to which a depletion layer 81 extends in the semiconductor wafer 51 in a case where a back-surface-side drain electrode 52 is rendered conductive. FIG. 15 and FIG. 16 show, as examples of the power MOSFET 57 shown in FIG. 9, the semiconductor wafer 51 including a power MOSFET having a trench gate structure. The semiconductor wafer 51 includes an $n^+$ layer 71 that has a high impurity concentration, an $n^-$ layer 72 that is layered in a surface portion on one side in a thickness direction of the $n^+$ layer 71, and a p-type base layer 73 formed by injecting p-type impurities into a surface portion on one side in a thickness direction of the $n^-$ layer 72.

The gate electrode 55 is formed, through a gate insulating film 75, in a trench that penetrates through the p-type base layer 73 of the semiconductor wafer 51 and reaches the inside of the $n^-$ layer 72. The source electrode 56 is formed so as to cover the gate electrode 55 through an interlayer insulating film 76 and be in contact with a source region 74 and the p-type base layer 73. The front-surface-side drain electrode 61 is formed so as to pass through an opening of the interlayer insulating film 76 and be in contact with the p-type base layer 73.

In a case where a voltage is applied between the front-surface-side drain electrode 61 and the source electrode 56 by rendering the front-surface-side drain electrode 61 conductive, as shown in FIG. 15, the depletion layer 80 fails to extend sufficiently toward the back surface side of the semiconductor wafer 51, that is, the bottom side in the sheet of FIG. 15. Accordingly, even if a defect or the like is present in proximity to the drain electrode 52 on back surface side, a leakage current resulting from the defect or the like cannot be measured with accuracy, whereby the defect or the like in proximity to the drain electrode 52 on the back surface side cannot be distinguished.

In contrast, as shown in FIG. 16, in a case where the drain electrode 52 on the back surface side is rendered conductive and a voltage is applied between the drain electrode 52 and the source electrode 56 in a conventional manner, the depletion layer 81 extends along an electric field generated in the $n^-$ layer 72, and as a result, extends to the vicinity of the drain electrode 52 on the back surface side. On this occasion, if there is a layer free from $n^+$ that is a part in which the $n^+$ layer 71 is not formed due to a pattern defect or the like, a defect can be distinguished by an increase in leakage current.

Therefore, in order to accurately measure the electrical characteristics of the semiconductor elements such as the power MOSFET 57, it is necessary to actually bring the drain electrode 52 on the back surface side into conduction and conduct a wafer test. For this reason, configurations according to the preferred embodiments described below are adopted in the method of measuring characteristics of a semiconductor element according to the present invention.

First Preferred Embodiment

Figure 1:
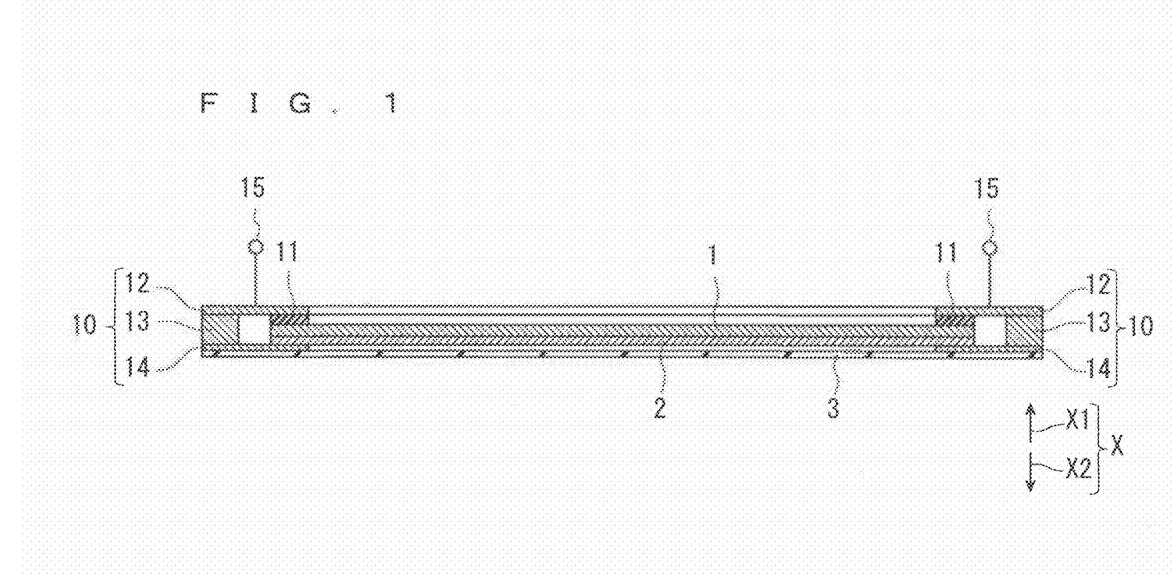
FIG. 1 is a cross-sectional view showing a state of a semiconductor wafer when a method of measuring characteristics of a semiconductor element according to a first preferred embodiment of the present invention is performed.
Figure 2:
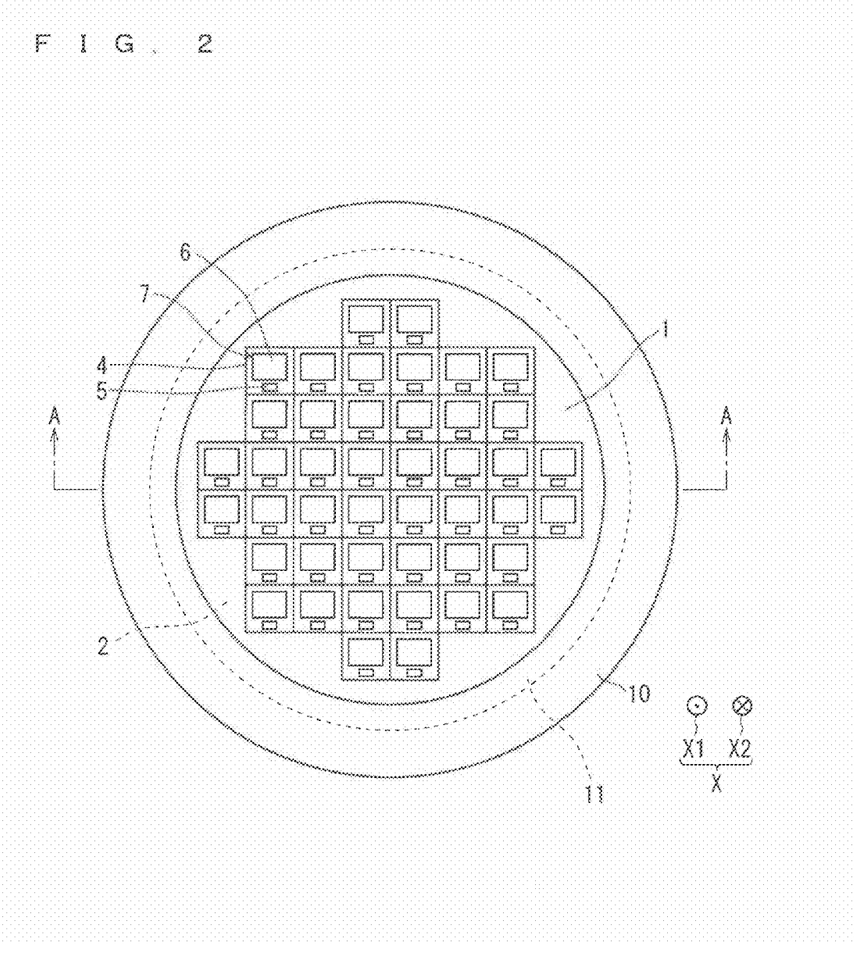
FIG. 2 is a plan view showing the semiconductor wafer shown in FIG. 1 viewed from one side in a thickness direction.
Figure 3:
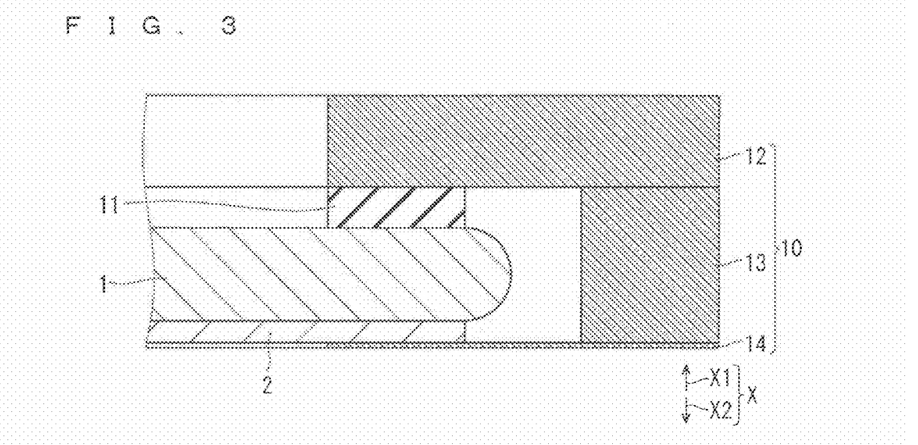
FIG. 3 is a cross-sectional view showing the vicinity of a measurement terminal shown in FIG. 1 in an enlarged manner.

FIG. 1 is a cross-sectional view showing a state of a semiconductor wafer 1 when a method of measuring characteristics of a semiconductor element according to a first preferred embodiment of the present invention is performed. FIG. 2 is a plan view showing the semiconductor wafer 1 shown in FIG. 1, which is viewed from one side X1 in a thickness direction. FIG. 1 corresponds to a cross-sectional view seen along a cutting plane line A-A in the plan view shown in FIG. 2. FIG. 3 is a cross-sectional view showing the vicinity of a measurement terminal 10 shown in FIG. 1 in an enlarged manner. In this preferred embodiment, a wafer test method for the semiconductor wafer 1 including power MOSFETs 7 as semiconductor elements is described as the method of measuring characteristics of a semiconductor element. The semiconductor wafer 1 corresponds to a semiconductor substrate.

Formed over an entire back surface of the semiconductor wafer 1 that is a surface portion on the other side X2 in the thickness direction thereof is a drain electrode 2 of the power MOSFET 7. The back surface of the semiconductor wafer 1 is attached to a support member 3 through the drain electrode 2. In other words, the support member 3 is attached to back surface of the semiconductor wafer 1 through the drain electrode 2. The support member 3 corresponds to a support member, which is attached to the semiconductor wafer 1 and supports the semiconductor wafer 1. The support member 3 is formed of, for example, an insulating sheet obtained by forming an insulating material into a sheet form or an insulating substrate made of an insulating material.

The semiconductor wafer 1 includes a plurality of regions to be divided into pieces as semiconductor chips 4 in a step described below. Though not shown in FIG. 1, formed in the surface portion on the one side X1 in the thickness direction of the semiconductor wafer 1 for each region serving as the semiconductor chip 4 are a gate electrode 5 and a source electrode 6 of the power MOSFET 7, as shown in FIG. 2.

In this manner, the power MOSFET 7 includes the gate electrode 5 and the source electrode 6 in the surface portion on the one side X1 in the thickness direction of the semiconductor wafer 1 and the drain electrode 2 in the surface portion on the other side X2 in the thickness direction of the semiconductor wafer 1. The gate electrode 5 and the source electrode 6 correspond to a one-side electrode, and the drain electrode 2 corresponds to the other-side electrode.

The method of measuring characteristics of a semiconductor element according to this preferred embodiment is performed as follows. First, in an arrangement step, the measurement terminal 10 is arranged at an edge of the semiconductor wafer 1. In this preferred embodiment, the measurement terminal 10 is arranged at the edge of the semiconductor wafer 1 that is a remaining region of the semiconductor wafer 1 except for the regions serving as the semiconductor chips 4.

The measurement terminal 10 includes a terminal contact portion 12 with which a probe terminal 15 is bought into contact, an electrode contact portion 14 being in contact with the drain electrode 2 that is the other-side electrode, and a connecting portion 13 that connects the terminal contact portion 12 and the electrode contact portion 14. The terminal contact portion 12 and the electrode contact portion 14 face each other and are integrally formed together with the connecting portion 13. The terminal contact portion 12, the connecting portion 13 and the electrode contact portion 14 are formed of a conductive material and have conductivity. This makes the measurement terminal 10 a conductive terminal having conductivity. The terminal contact portion 12 is electrically connected to the electrode contact portion 14 through the connecting portion 13. The electrode contact portion 14 corresponds to a first conductive part, and the terminal contact portion 12 corresponds to a second conductive part.

The measurement terminal 10 is arranged at the edge of the semiconductor wafer 1 such that the electrode contact portion 14 is in contact with the drain electrode 2 on the other side X2 in the thickness direction of the semiconductor wafer 1 and that the terminal contact portion 12 is exposed to the one side X1 in the thickness direction of the semiconductor wafer 1. Further, the measurement terminal 10 is arranged apart from the gate electrodes 5 and the source electrodes 6. In this preferred embodiment, the measurement terminal 10 is arranged in the surface portion on the one side X1 in the thickness direction of the semiconductor wafer 1 such that the terminal contact portion 12 is apart from the gate electrodes 5 and the source electrodes 6.

The measurement terminal 10 is arranged at the edge of the semiconductor wafer 1 in this manner, whereby it is possible to draw the drain electrode 2 formed on the back surface of the semiconductor wafer 1, which is the surface portion on the other side X2 in the thickness direction thereof, toward the front surface side that is the one side X1 in the thickness direction of the semiconductor wafer 1 through the measurement terminal 10.

Specifically, the measurement terminal 10 is arranged at the edge of the semiconductor wafer 1 so as to sandwich the semiconductor wafer 1 between the electrode contact portion 14 and the terminal contact portion 12. More specifically, the measurement terminal 10 is arranged at the edge of the semiconductor wafer 1 such that the terminal contact portion 12 faces the surface portion on the one side X1 in the thickness direction of the semiconductor wafer 1. In other words, the terminal contact portion 12 is arranged on the one side X1 in the thickness direction of the semiconductor wafer 1 and covers the edge of the semiconductor wafer 1 from the one side X1 in the thickness direction.

The electrode contact portion 14 is arranged on the other side X2 in the thickness direction of the semiconductor wafer 1 and covers the edge of the semiconductor wafer 1 from the other side X2 in the thickness direction. The connecting portion 13 is arranged on the side of the semiconductor wafer 1 and connects the edge on a side opposite to the side of the terminal contact portion 12 that covers the semiconductor wafer 1 and the edge on a side opposite to the side of the electrode contact portion 14 that covers the semiconductor wafer 1. The terminal contact portion 12 and the electrode contact portion 14 are formed to have approximately the same shape and dimension when viewed from the one side X1 in the thickness direction of the semiconductor wafer 1, which are arranged so as to overlap one another on the whole.

While FIG. 1 and FIG. 3 show the electrode contact portion 14 of the measurement terminal 10 to be relatively thick, it is actually preferable that, in order to take a measure against a warp of the semiconductor wafer 1 on the support member 3, the electrode contact portion 14 of the measurement terminal 10 be formed as a much thinner electrode compared with the drain electrode 2 and the support member 3. Specifically, it is preferred that the electrode contact portion 14 be formed of a conductive tape or a conductive thin film.

The electrode contact portion 14 formed of a conductive tape or a conductive thin film is capable of preventing an occurrence in which a warp of the semiconductor wafer 1 cannot be corrected by the support member 3 due to the electrode contact portion 14 being interposed between the drain electrode 2 and the support member 3. That is, it is possible to reduce an influence due to the electrode contact portion 14 being interposed between the drain electrode 2 and the support member 3 as much as possible, and accordingly a warp of the semiconductor wafer 1 can be corrected by the support member 3. Therefore, it is possible to prevent the semiconductor wafer 1 from being damaged, for example, cracked or broken in a wafer test.

In this preferred embodiment, the measurement terminal 10 is arranged so as to sandwich the semiconductor wafer 1 therein through an insulating plate 11. The insulating plate 11 is arranged between the terminal contact portion 12 of the measurement terminal 10 and the surface portion on the one side X1 in the thickness direction of the semiconductor wafer 1. The insulating plate 11 is required to have a dielectric strength voltage equal to or higher than the voltage applied to the drain.

In this preferred embodiment, the semiconductor wafer 1 has a disc shape. The measurement terminal 10 has an annular shape, more specifically, a substantially cylindrical shape, and is arranged entirely in the circumferential direction at the outer peripheral edge of the semiconductor wafer 1. Specifically, the measurement terminal 10 is arranged so as to cover the outer peripheral edge of the semiconductor wafer 1 at an inner peripheral edge thereof. More specifically, the measurement terminal 10 is formed by connecting the outer peripheral edges of the annular-shaped, more specifically, annular-plate-shaped terminal contact portion 12 and electrode contact portion 14 by the annular-shaped, more specifically, cylindrical connecting portion 13. The connecting portion 13 is arranged outside the semiconductor wafer 1 in the radial direction. The measurement terminal 10 is arranged so as to sandwich the outer peripheral edge of the semiconductor wafer 1, specifically, the outer peripheral edge of the semiconductor wafer 1 including the drain electrode 2 by the inner peripheral edges of the terminal contact portion 12 and the electrode contact portion 14.

The shape of the semiconductor wafer 1 is not limited to a disc shape, and may be other shape such as a rectangular shape. The shape of the measurement terminal 10 is selected so as to cover the outer peripheral edge of the semiconductor wafer 1 entirely in the circumferential direction, in consideration of the shape of the semiconductor wafer 1.

In the arrangement step, when the measurement terminal 10 is arranged at the edge of the semiconductor wafer 1, first, a terminal member obtained by integrally forming a terminal contact portion and a connecting portion is prepared by bonding the annular, more specifically, cylindrical connecting portion 13 to the outer peripheral edge of the annular, more specifically, annular-plate-shaped terminal contact portion 12 in the surface portion on the other side X2 in the thickness direction. This terminal member is mounted onto the outer peripheral edge in the surface portion on the one side X1 in the thickness direction of the semiconductor wafer 1. In this preferred embodiment, the insulating plate 11 is arranged between the terminal contact portion 12 and the surface portion on the one side X1 in the thickness direction of the semiconductor wafer 1. Accordingly, the terminal member is mounted onto the outer peripheral edge in the surface portion on the one side X1 in the thickness direction of the semiconductor wafer 1 through the insulating plate 11.

After that, the electrode contact portion 14 is arranged over the outer peripheral edge in the surface portion on the other side X2 in the thickness direction of the semiconductor wafer 1, specifically, over the outer peripheral edge of the drain electrode 2 that is formed in the surface portion on the other side X2 in the thickness direction of the semiconductor wafer 1 and the surface portion on the other side X2 in the thickness direction of the connecting portion 13. For example, the electrode contact portion 14 is arranged by attaching a conductive tape or a conductive thin film thereto. The electrode contact portion 14 is arranged entirely in the circumferential direction of the outer peripheral edge of the semiconductor wafer 1 and the connecting portion 13.

As described above, the measurement terminal 10 is arranged at the edge of the semiconductor wafer 1 in the arrangement step. Then, in an attachment step, the support member 3 is attached to the back surface of the semiconductor wafer 1, which is the surface portion on the other side X2 in the thickness direction thereof, through the drain electrode 2. Then, in a measurement step, the electrical characteristics of the power MOSFET 7 are measured by bringing a probe terminal into contact with the terminal contact portion 12 of the measurement terminal 10, the gate electrode 5 and the source electrode 6. The electrical characteristics include, for example, the breakdown voltage of the power MOSFET 7 and the leakage current generated when a high voltage is applied between the drain electrode 2 and the source electrode 6.

In this preferred embodiment, the measurement terminal 10 is arranged at the edge of the semiconductor wafer 1 in the arrangement step, and accordingly the drain electrode 2 formed on the back surface side of the semiconductor wafer 1 can be drawn toward the front surface side of the semiconductor wafer 1 by the measurement terminal 10. As a result, the conductive portion for bringing the drain electrode 2 into conduction can be achieved on the front surface side of the semiconductor wafer 1. Specifically, the drain electrode 2 can be rendered conductive from the front surface side of the semiconductor wafer 1 by bringing the probe terminal 15 into contact with the terminal contact portion 12 of the measurement terminal 10 from the front surface side of the semiconductor wafer 1. The gate electrode 5 and the source electrode 6 are formed on the front surface side of the semiconductor wafer 1, and thus similarly to the conventional technology, they can be rendered conductive from the front surface side of the semiconductor wafer 1 by bringing the probe terminal into contact with the gate electrode 5 and the source electrode 6.

As described above, in this preferred embodiment, the drain electrode 2 on the back surface side can be rendered conductive from the front surface side of the semiconductor wafer 1 by bringing the probe terminal 15 into contact with the terminal contact portion 12 of the measurement terminal 10 from the front surface side of the semiconductor wafer 1. Accordingly, even in a case where the insulating support member 3 is attached to the back surface side of the semiconductor wafer 1 as shown in FIG. 1, the electrical characteristics of the power MOSFET 7 can be measured with accuracy by the probing method of performing measurement using a probe terminal. Specifically, the electrical characteristics of the power MOSFET 7 can be accurately measured from the front surface side of the semiconductor wafer 1 by bringing the probe terminal into contact with the terminal contact portion 12 of the measurement terminal 10, the gate electrode 5 and the source electrode 6 from the front surface side of the semiconductor wafer 1.

For example, a voltage can be applied between the drain electrode 2 on the back surface side and the source electrode 6 from the front surface side of the semiconductor wafer 1 by bringing a probe terminal into contact with the terminal contact portion 12 of the measurement terminal 10 and the source electrode 6 from the front surface side of the semiconductor wafer 1, whereby the breakdown voltage of the power MOSFET 7 can be measured with accuracy by the probing method. In addition, it is possible to accurately measure the leakage current generated when a high voltage is applied between the drain electrode 2 and the source electrode 6. Accordingly, whether or not the leakage current has been increased can be determined with higher accuracy, which makes it possible to accurately distinguish a defect in the vicinity of the drain electrode 2 on the back surface side.

Further, in this preferred embodiment, the measurement terminal 10 is arranged at the edge of the semiconductor wafer 1 so that the terminal contact portion 12 faces the surface portion on the one side X1 in the thickness direction of the semiconductor wafer 1, and the insulating plate 11 is arranged between the terminal contact portion 12 of the measurement terminal 10 and the surface portion on the one side X1 in the thickness direction of the semiconductor wafer 1. As a result, the measurement terminal 10 and the surface portion on the one side X1 in the thickness direction of the semiconductor wafer 1 can be insulated from each other more reliably compared with the case where the insulating plate 11 is not provided, whereby it is possible to more reliably insulate the drain electrode 2 and the surface portion on the one side X1 in the thickness direction of the semiconductor wafer 1 from each other. Accordingly, it is possible to prevent the drain electrode 2 and the electrode on the front surface side of the semiconductor wafer 1, for example, the source electrode 6 from short-circuiting. Therefore, the breakdown voltage of the power MOSFET 7 can be measured with higher accuracy by, in the probing method, bringing a probe terminal into contact with the terminal contact portion 12 of the measurement terminal 10 and the source electrode 6.

The insulating plate 11 corresponds to an insulating member. The insulating member arranged between the measurement terminal 10 and the surface portion on the one side X1 in the thickness direction of the semiconductor wafer 1 is not limited to the insulating plate 11, and may be an insulating member that has insulating properties and a dielectric strength voltage equal to or higher than the voltage applied to the drain.

Second Preferred Embodiment

Figure 4:
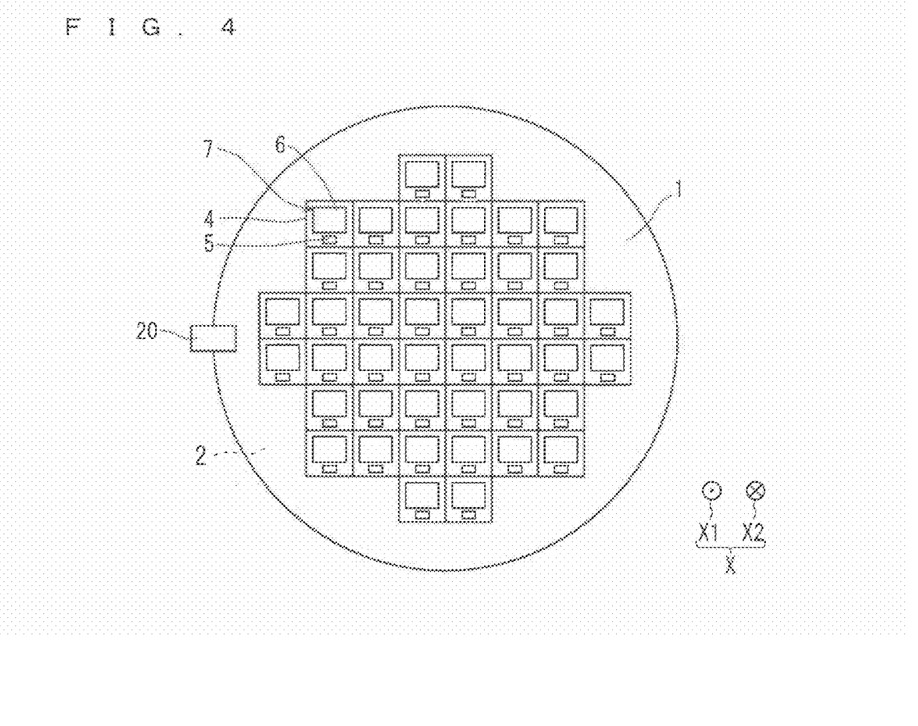
FIG. 4 is a plan view showing a semiconductor wafer viewed from one side in a thickness direction when a method of measuring characteristics of a semiconductor element according to a second preferred embodiment of the present invention is performed.

FIG. 4 is a plan view showing the semiconductor wafer 1 when a method of measuring characteristics of a semiconductor element according to a second preferred embodiment of the present invention is performed, which is viewed from the one side X1 in the thickness direction. In this preferred embodiment, a measurement terminal 20 shown in FIG. 4 is used in place of the above-mentioned measurement terminal 10 according to the first preferred embodiment that is shown in FIG. 1 to FIG. 3. The method of measuring characteristics of a semiconductor element according to this preferred embodiment is similar to the method of measuring characteristics of a semiconductor element according to the first preferred embodiment except for that the measurement terminal 20 shown in FIG. 4 is used, and hence common description is omitted. In addition, parts corresponding to those of FIG. 1 to FIG. 3 described above are denoted by the same reference numerals in FIG. 4, and common description is omitted.

The measurement terminal 10 used in the first preferred embodiment has an annular shape, more specifically, substantially cylindrical shape as described above, and is arranged over the entire outer peripheral edge of the semiconductor wafer 1. In contrast to this, the measurement terminal 20 used in this preferred embodiment is arranged at a part of the edge of the semiconductor wafer 1, specifically, a part in the circumferential direction at the outer peripheral edge of the semiconductor wafer 1.

The measurement terminal 20 according to this preferred embodiment is similar to the measurement terminal 10 according to the first preferred embodiment shown in FIG. 1 to FIG. 3 except for that the measurement terminal 20 is arranged at a part of the outer peripheral edge in the circumferential direction of the semiconductor wafer 1. The measurement terminal 20 according to this preferred embodiment includes the above-mentioned terminal contact portion 12, connecting portion 13 and electrode contact portion 14 shown in FIG. 3, similarly to the measurement terminal 10 according to the first preferred embodiment.

In this preferred embodiment, the terminal contact portion 12 has a rectangular solid shape and is arranged such that a longitudinal direction thereof extends along a radial direction of the semiconductor wafer 1. The electrode contact portion 14 has a rectangular sheet shape and is arranged such that a longitudinal direction thereof extends along the radial direction of the semiconductor wafer 1. The terminal contact portion 12 and the electrode contact portion 14 are formed to have approximately the same shape and dimension when viewed from the one side X1 in the thickness direction of the semiconductor wafer 1, which are arranged so as to overlap one another on the whole.

The terminal contact portion 12 and the electrode contact portion 14 are arranged such that one ends thereof in the longitudinal direction cover a part of the outer peripheral portion in the circumferential of the semiconductor wafer 1. The other ends of the terminal contact portion 12 and the electrode contact portion 14 in the longitudinal direction are connected to each other by the connecting portion 13. Also in this preferred embodiment, similarly to the first preferred embodiment, the insulating plate 11 is arranged between the terminal contact portion 12 and the surface portion in the one side X1 in the thickness direction of the semiconductor wafer 1, specifically, between the terminal contact portion 12 and the outer peripheral edge of the semiconductor wafer 1 as shown in FIG. 3 as described above.

In this preferred embodiment, the measurement terminal 20 in which the electrode contact portion 14 and the terminal contact portion 12 face each other and are formed integrally together with the connecting portion 13 is prepared as a measurement terminal in an arrangement step. Then, the measurement terminal 20 is arranged at a part of the edge of the semiconductor wafer 1, specifically, a part at the outer peripheral edge in the circumferential direction of the semiconductor wafer 1 such that the semiconductor wafer 1 is sandwiched between the electrode contact portion 14 and the terminal contact portion 12. As a result, the measurement terminal 20 can be easily arranged at a part of the edge of the semiconductor wafer 1.

According to this preferred embodiment, the measurement terminal 20 is arranged at the edge of the semiconductor wafer 1 similarly to the first preferred embodiment, and thus the drain electrode 2 on the back surface side of the semiconductor wafer 1 can be rendered conductive from the front surface side thereof, which enables to measure the electrical characteristics of the power MOSFET 7 with accuracy. Further, in this preferred embodiment, the measurement terminal 20 is arranged at a part at the outer peripheral edge of the semiconductor wafer 1 and thus the amount of the terminal material that is the material for manufacturing the measurement terminal 20 can be more reduced compared with the first preferred embodiment.

Third Preferred Embodiment

Figure 5:
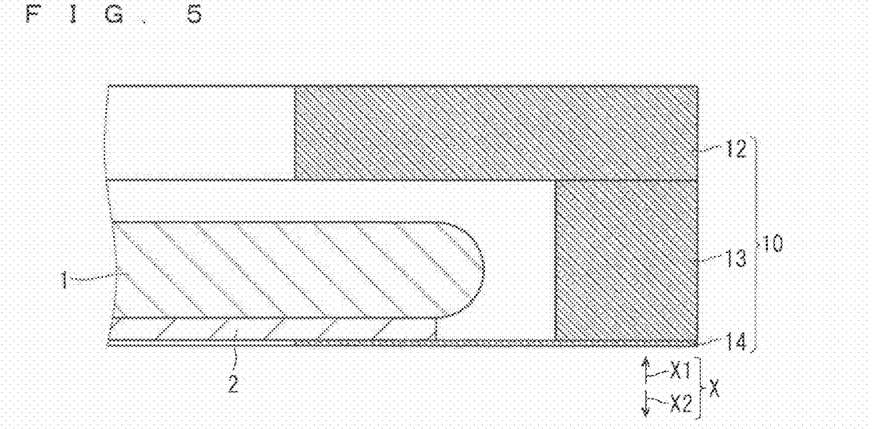
FIG. 5 is a cross-sectional view showing a state of a semiconductor wafer when a method of measuring characteristics of a semiconductor element according to a third preferred embodiment of the present invention is performed.

FIG. 5 is a cross-sectional view showing a state of the semiconductor wafer 1 when a method of measuring characteristics of a semiconductor element according to a third preferred embodiment of the present invention is performed. In this preferred embodiment, an insulating member such as the insulating plate 11 shown in FIG. 3 is not arranged between the measurement terminal 10 and the surface portion on the one side X1 in the thickness direction of the semiconductor wafer 1. The method of measuring characteristics of a semiconductor element according to this preferred embodiment is similar to the method of measuring characteristics of a semiconductor element according to the first preferred embodiment except for that an insulating member such as the insulating plate 11 is not arranged between the measurement terminal 10 and the surface portion on the one side X1 in the thickness direction of the semiconductor wafer 1, and hence common description is omitted. In addition, parts corresponding to those of FIG. 1 to FIG. 3 described above are denoted by the same reference numerals in FIG. 5, and common description is omitted.

Also in this preferred embodiment, the measurement terminal 10 is arranged at the edge of the semiconductor wafer 1 as in the first preferred embodiment. As a result, the drain electrode 2 on the back surface side of the semiconductor wafer 1 can be rendered conductive from the front surface side thereof, which enables accurate measurement of the electrical characteristics of the power MOSFET 7. Further, in this preferred embodiment, an insulating member such as the insulating plate 11 is not arranged between the measurement terminal 10 and the surface portion on the one side X1 in the thickness direction of the semiconductor wafer 1, and thus it is possible to prevent an occurrence of a malfunction, for example, a malfunction in which measurement cannot be performed due to deterioration of an insulating member.

In this preferred embodiment, while the description has been given of the case of adopting the configuration in which an insulating member such as the insulating plate 11 is not arranged in the first preferred embodiment, the configuration in which an insulating member such as the insulating plate 11 is not arranged may be applied in the case where the measurement terminal 20 is used in the second preferred embodiment.

Figure 6:
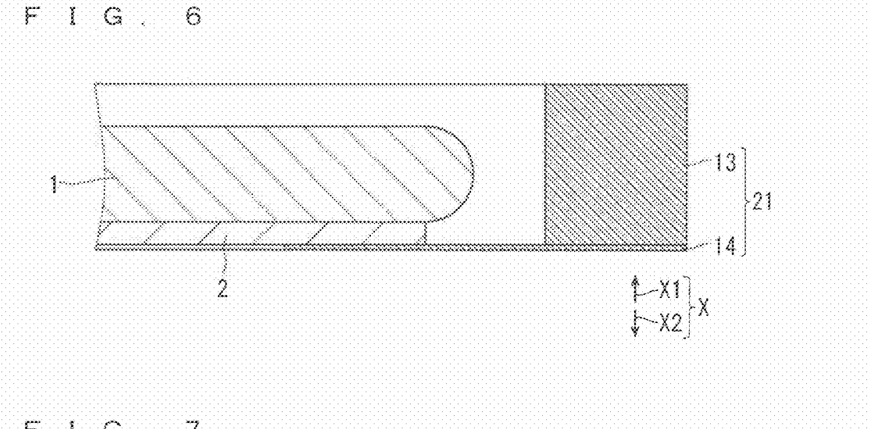
FIG. 6 is a cross-sectional view showing a measurement terminal of another example of the measurement terminal.
Figure 7:
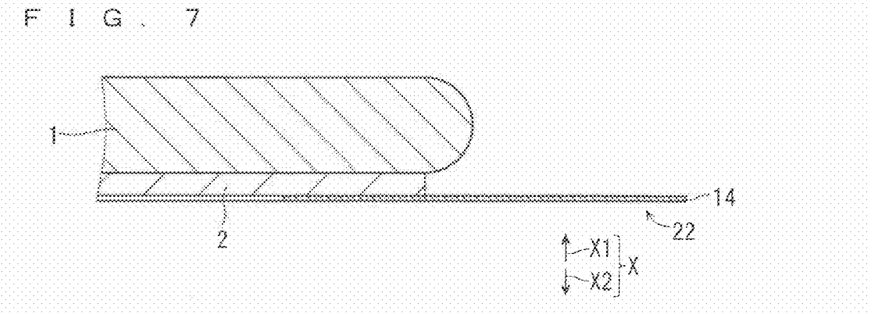
FIG. 7 is a cross-sectional view showing a measurement terminal of still another example of the measurement terminal.

The measurement terminals 10 and 20 used in the first to third preferred embodiments described above include the terminal contact portion 12, the connecting portion 13 and the electrode contact portion 14 as shown in FIG. 3. However, the configuration of the measurement terminal is not limited thereto. FIG. 6 is a cross-sectional view showing a measurement terminal 21 that is another example of the measurement terminal. FIG. 7 is a cross-sectional view showing a measurement terminal 22 that is still another example of the measurement terminal. The measurement terminal may have a simplified configuration as shown in FIG. 6 and FIG. 7.

The measurement terminal 21 shown in FIG. 6 has a configuration in which the terminal contact portion 12 is removed from the above-mentioned measurement terminal 10 shown in FIG. 3. In other words, the measurement terminal 21 shown in FIG. 6 includes the electrode contact portion 14 and the connecting portion 13 of the measurement terminal 10 that are shown in FIG. 3. In this case, the connecting portion 13 functions as a terminal contact portion. That is, the measurement terminal 21 shown in FIG. 6 is configured by the connecting portion 13, which is a terminal contact portion, being bonded to the electrode contact portion 14. In the measurement terminal 21 shown in FIG. 6, the electrode contact portion 14 corresponds to the first conductive part, and the connecting portion 13 corresponds to the second conductive part.

Similarly to the measurement terminal 10 according to the first preferred embodiment, the measurement terminal 21 shown in FIG. 6 is arranged entirely in the circumferential direction at the outer peripheral edge of the semiconductor wafer 1. The configuration of the measurement terminal 21 shown in FIG. 6 may be applied to the measurement terminal 20 according to the second preferred embodiment so as to be arranged at a part of the outer peripheral edge of the semiconductor wafer 1. Alternatively, the configuration of the measurement terminal 21 may be applied to the third preferred embodiment so that an insulating member such as the insulating plate 11 is not arranged between the measurement terminal 21 and the surface portion on the one side X1 in the thickness direction of the semiconductor wafer 1.

The measurement terminal 22 shown in FIG. 7 has the configuration in which the terminal contact portion 12 and the connecting portion 13 are removed from the above-mentioned measurement terminal 10 shown in FIG. 3. In other words, the measurement terminal 22 shown in FIG. 7 includes the electrode contact portion 14 of the measurement terminal 10 shown in FIG. 3. In this case, the electrode contact portion 14 also functions as a terminal contact portion. In the measurement terminal 22 shown in FIG. 7, the electrode contact portion 14 corresponds to the first conductive part and the second conductive part. Specifically, an inner peripheral edge of the electrode contact portion 14, which is the part being in contact with the drain electrode 2, corresponds to the first conductive part. The part of the electrode contact portion 14, which is a remaining part other than the part being in contact with the drain electrode 2 and is exposed to the one side X1 in the thickness direction of the semiconductor wafer 1, that is, the outer peripheral edge of the electrode contact portion 14 corresponds to the second conductive part.

Similarly to the measurement terminal 10 according to the first preferred embodiment, the measurement terminal 22 shown in FIG. 7 is arranged entirely in the circumferential direction at the outer peripheral edge of the semiconductor wafer 1. The configuration of the measurement terminal 22 shown in FIG. 7 may be applied to the measurement terminal 20 according to the second preferred embodiment so as to be arranged at a part of the outer peripheral edge of the semiconductor wafer 1. Alternatively, the configuration of the measurement terminal 22 may be applied to the third preferred embodiment so that an insulating member such as the insulating plate 11 is not arranged between the measurement terminal 22 and the surface portion on the one side X1 in the thickness direction of the semiconductor wafer 1.

Similar effects to those of the first to third preferred embodiments can be obtained with the use of the measurement terminals 21 and 22 simplified as shown in FIG. 6 and FIG. 7. Specifically, the drain electrode 2 on the back surface side of the semiconductor wafer 1 can be rendered conductive from the front surface side thereof, which makes it possible to obtain an effect of measuring the electrical characteristics of the power MOSFET 7 with accuracy.

A method of manufacturing a semiconductor device according to a preferred embodiment of the present invention is performed using the method of measuring characteristics of a semiconductor element described above. In the method of manufacturing a semiconductor device according to this preferred embodiment, first, the semiconductor wafer 1 is prepared. The semiconductor wafer 1 is obtained by, for example, subjecting a bare wafer obtained by slicing an ingot to be slim to treatments such as ion implantation of n type or p type impurities, etching and formation of an insulating film and forming the power MOSFET (hereinafter, also merely referred to as a "MOSFET") 7. As shown in FIG. 2 described above, at least one MOSFET 7 is formed in each region serving as the semiconductor chip 4 of the semiconductor wafer 1. In this preferred embodiment, one MOSFET 7 is formed for each region serving as the semiconductor chip 4.

Next, the electrical characteristics of the MOSFET 7 formed on the semiconductor wafer 1 are measured by the above-mentioned method of measuring characteristics of a semiconductor element. After that, the semiconductor wafer 1 is cut so as to include at least one MOSFET 7, to thereby obtain the semiconductor chips 4. In this preferred embodiment, the semiconductor wafer 1 is cut for each region serving as the semiconductor chip 4 shown in FIG. 2 described above, to thereby obtain the semiconductor chips 4. The semiconductor device is assembled with the obtained semiconductor chips 4. In this case, semiconductor chips including the MOSFET 7, which has been determined not to be defective, that is, has been determined to be a non-defective item in the measurement of characteristics of a semiconductor element using the method of measuring characteristics of a semiconductor element, are used as the semiconductor chips 4.

According to the above-mentioned method of measuring characteristics of a semiconductor element, even in a case where the insulating support member 3 is attached to the surface portion on the other side X2 in the thickness direction of the semiconductor wafer 1, the electrical characteristics of the MOSFET 7 can be accurately measured from the one side X1 in the thickness direction of the semiconductor wafer 1. The method of manufacturing a semiconductor device according to this preferred embodiment is performed using the above-mentioned method of measuring characteristics of a semiconductor element, whereby it is possible to more reliably distinguish the semiconductor chips 4 including a non-defective MOSFET 7 by distinguishing the semiconductor chips 4 based on the measurement results on the electrical characteristics of the MOSFET 7. Accordingly, the semiconductor device can be assembled with the non-defective semiconductor chips 4. This results in improvements in manufacturing yield of a semiconductor device.

The method of measuring characteristics of a semiconductor element according to the present invention is effective for a thin wafer that is considerably warped, and in particularly, is extremely effective for a wafer having a thickness of 120 µm or smaller in which a support member is required for a wafer in grinding of a wafer. In other words, the method of measuring characteristics of a semiconductor element according to the present invention is particularly effective for the method of manufacturing a semiconductor device using the semiconductor wafer 1 having a thickness dimension of 120 µm or smaller, and it is possible to achieve a particularly high effect in a case of being applied to the above-mentioned method of manufacturing a semiconductor device.

The method of measuring characteristics of a semiconductor element according to the present invention is applicable to the cases where semiconductor devices are manufactured using semiconductor wafers formed of various semiconductor substrates, which are not limited by the type of the semiconductor wafer 1. For example, the method according to the present invention is applicable to a case where a semiconductor device is manufactured using a semiconductor wafer formed of a silicon carbide (SiC) substrate. A semiconductor device including a semiconductor element using silicon carbide (hereinafter, also referred to as a "silicon carbide semiconductor element") is manufactured with the use of a semiconductor wafer formed of a SiC substrate. A silicon carbide semiconductor element is under development as a device expected to have high efficiency.

In the method of manufacturing a semiconductor device in which a semiconductor device including the above-mentioned silicon carbide semiconductor element expected to have high efficiency is manufactured, it is possible to obtain similar effects to those of the first to third preferred embodiments described above by application of the method of measuring characteristics of a semiconductor element according to the present invention. Specifically, there can be obtained such an effect that the drain electrode 2 on the back surface side of the semiconductor wafer 1 can be rendered conductive from the front surface side thereof, and accordingly the electrical characteristics of the power MOSFET 7 can be measured with accuracy.

While the description has been given of the case where the power MOSFET 7 is provided as a semiconductor element in the respective preferred embodiments described above, a semiconductor element is not limited to a power MOSFET. Any semiconductor elements are possible as long as they have an electrode on the back surface of the semiconductor wafer 1, and effects similar to those of the respective preferred embodiments can be obtained by, for example, an insulated gate bipolar transistor (IGBT) or a diode.

While the invention has been shown and described in detail, the foregoing description is in all aspects illustrative and not restrictive. It is therefore understood that numerous modifications and variations can be devised without departing from the scope of the invention.

What is claimed is:

1. A method of measuring characteristics of a semiconductor element, the semiconductor element including a one-side electrode in a surface portion on one side in a thickness direction of a semiconductor substrate and including the other-side electrode in a surface portion on the other side in the thickness direction of said semiconductor substrate, the method comprising:

an arrangement step of arranging, at an edge of said semiconductor substrate, a measurement terminal including a first conductive part having conductivity and a second conductive part having conductivity and electrically connected to said first conductive part to be apart from said one-side electrode so that said first conductive part is in contact with the other-side electrode on the other side in the thickness direction of said semiconductor substrate and that said second conductive part is exposed to the one side in the thickness direction of said semiconductor substrate; and a measurement step of measuring electrical characteristics of said semiconductor element by bringing a probe terminal into contact with said second conductive part and said one-side electrode from the one side in the thickness direction of said semiconductor substrate.

2. The method of measuring characteristics of a semiconductor element according to claim 1, wherein said measurement terminal is arranged at a part of the edge of said semiconductor substrate in said arrangement step.

3. The method of measuring characteristics of a semiconductor element according to claim 2, wherein in said arrangement step:

the measurement terminal is prepared as said measurement terminal, the measurement terminal including said first conductive part and said second conductive part integrally formed so as to be opposed to each other; and said measurement terminal is arranged at the part of the edge of said semiconductor substrate so that said semiconductor substrate is sandwiched between said first conductive part and said second conductive part.

4. The method of measuring characteristics of a semiconductor element according to claim 1, wherein in said arrangement step, said measurement terminal is arranged at the edge of said semiconductor substrate so that said second conductive part is opposed to the surface portion on the one side in the thickness direction of said semiconductor substrate, and an insulating member having insulating properties is arranged between said second conductive part and the surface portion on the one side in the thickness direction of said semiconductor substrate.

5. The method of measuring characteristics of a semiconductor element according to claim 1, further comprising, between said arrangement step and said measurement step, an attachment step of attaching a support member supporting said semiconductor substrate to the surface portion on the other side in the thickness direction of said semiconductor substrate.

6. A method of manufacturing a semiconductor device, comprising the steps of:
preparing a semiconductor substrate including a plurality of semiconductor elements formed thereon, the semiconductor elements each including a one-side electrode in a surface portion on one side in a thickness direction of said semiconductor substrate and including the other-side electrode in a surface portion on the other side in the thickness direction of said semiconductor substrate;
measuring electrical characteristics of said semiconductor elements by the method of measuring characteristics of a semiconductor element according to claim 1;
obtaining semiconductor chips by cutting said semiconductor substrate so as to include at least one of said semiconductor elements; and
assembling a semiconductor device using said semiconductor chips.

7. The method of manufacturing a semiconductor device according to claim 6, wherein said semiconductor substrate has a thickness dimension of 120 µm or smaller.

8. The method of manufacturing a semiconductor device according to claim 6, wherein said semiconductor substrate is a silicon carbide (SiC) substrate.

* * * * *